(12) United States Patent  (10) Patent No.: US 6,977,434 B2
Martino  (45) Date of Patent: Dec. 20, 2005

(54) SEMICONDUCTOR ASSEMBLY AND SPRING MEMBER THEREFOR

(75) Inventor: Peter Miguel Martino, Windham, NJ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 8 days.

(21) Appl. No.: 10/690,397

(22) Filed: Oct. 20, 2003

(65) Prior Publication Data

US 2005/0082665 A1  Apr. 21, 2005

(51) Int. Cl.$^7$ .............................................. H01L 23/34
(52) U.S. Cl. ...................................... 257/727; 257/718
(58) Field of Search ................................ 257/727, 718, 257/688

(56) References Cited

U.S. PATENT DOCUMENTS 6,191,480 B1 * 2/2001 Kastberg et al. ............ 257/727
6,619,973 B2 * 9/2003 Perino et al. ................ 439/327
6,750,551 B1 * 6/2004 Frutschy et al. ............ 257/785

* cited by examiner

Primary Examiner—Mark V. Prenty

(57) ABSTRACT

A semiconductor assembly comprises a semiconductor package comprising a substrate, a die positioned on the substrate, and a lid positioned on the die. A receiver receives the semiconductor package. A clamp engages the lid of the semiconductor package and the receiver and applies a clamping force to the lid of the semiconductor package to hold the semiconductor package to the receiver. A spring member having a clamp contact portion and a substrate contact portion is positioned between the clamp and the substrate of the semiconductor package so that the clamp contact portion of the spring member contacts the clamp and so that the substrate contact portion of the spring member contacts the substrate of the semiconductor package, the spring member transferring a portion of the clamping force from the lid of the semiconductor package to the substrate of the semiconductor package.

15 Claims, 1 Drawing Sheet

SEMICONDUCTOR ASSEMBLY AND SPRING MEMBER THEREFOR

TECHNICAL FIELD

This invention relates to mounting systems for semiconductor packages in general and more specifically to a mounting system for transferring a portion of the clamping force from the lid to the substrate of a semiconductor package.

BACKGROUND

Many different types of semiconductor packaging systems have been developed and are being used. One such type of packaging system, commonly referred to as a land grid array or LGA package, typically involves a substrate having a plurality of lands provided thereon. A semiconductor die or circuit is positioned on the substrate and is electrically connected thereto so that various circuit nodes of the semiconductor die are electrically connected to the lands provided on the substrate. A cover or lid is positioned over the semiconductor die, thereby resulting in a layered structure. The resulting semiconductor package (e.g., an LGA package) may be mounted to a circuit board or printed wiring board, whereupon the semiconductor package becomes connected to other electronic circuitry provided on the printed wiring board.

One system for mounting the semiconductor package to the printed wiring board utilizes a clamp to hold or clamp the semiconductor package to a suitable package receiver, such as a socket, provided on the printed wiring board. The clamp engages the lid of the semiconductor package and applies a clamping force thereto, thereby securely holding or sandwiching the semiconductor package between the clamp and the package receiver. While this type of mounting system is effective from a functional standpoint, it is not without disadvantages. For example, a large land grid array (LGA) semiconductor package requires a large clamping force to ensure reliable electrical contact between the lands provided on the package and the corresponding contacts provided on the receiver (e.g., socket). Unfortunately, such large clamping forces tend to create large stresses in the semiconductor package, which may lead to unacceptable deformation and/or structural failure of the semiconductor package.

SUMMARY OF THE INVENTION

A semiconductor assembly may comprise a semiconductor package having a substrate, a die positioned on the substrate, and a lid positioned on the die. A receiver receives the semiconductor package. A clamp engages the lid of the semiconductor package and the receiver and applies a clamping force to the lid of the semiconductor package to hold the semiconductor package to the receiver. A spring member having a clamp contact portion and a substrate contact portion is positioned between the clamp and the substrate of the semiconductor package so that the clamp contact portion of the spring member contacts the clamp and so that the substrate contact portion of the spring member contacts the substrate of the semiconductor package. The spring member transfers a portion of the clamping force from the lid of the semiconductor package to the substrate of the semiconductor package.

Also disclosed is a spring member that comprises a clamp contact portion and a substrate contact portion. The spring member is positionable between a clamp and a substrate of a semiconductor package, so that the spring member transfers to the substrate of the semiconductor package a portion of a clamping force applied by the clamp to a lid of the semiconductor package.

BRIEF DESCRIPTION OF THE DRAWINGS

Illustrative and presently preferred exemplary embodiments of the invention are shown in the drawings in which.

DETAILED DESCRIPTION

Figure 1:
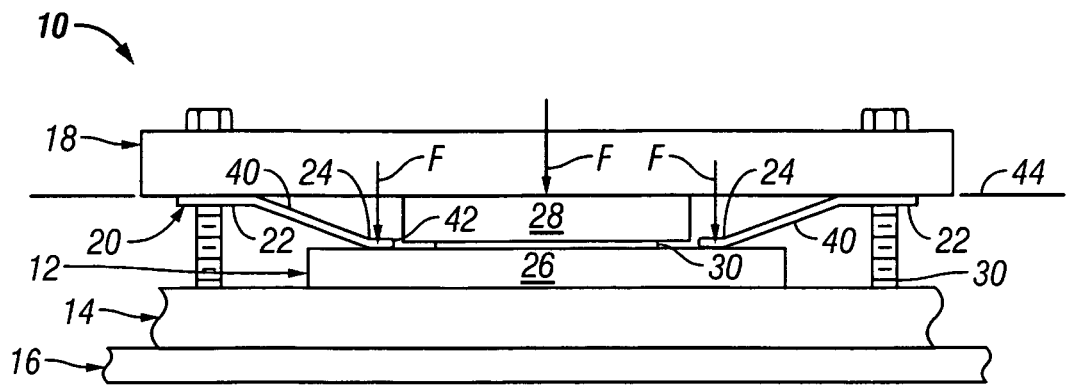
FIG. 1 is a side view in elevation of a semiconductor assembly and spring member according to one embodiment of the invention.
Figure 2:
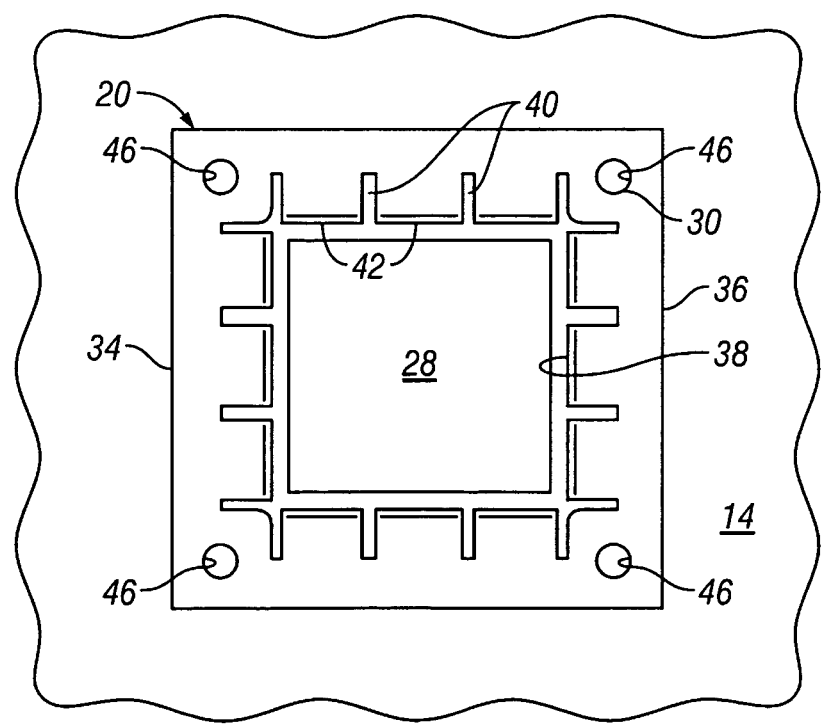
FIG. 2 is a plan view of the semiconductor assembly illustrated in FIG. 1 with the clamp removed to more clearly show the spring member.

A semiconductor assembly 10 is illustrated in FIGS. 1 and 2 as it could be used to secure or clamp a semiconductor package 12 to a semiconductor package receiver 14 provided on a printed wiring board 16. More specifically, the semiconductor assembly 10 comprises a clamp 18 and a biasing or spring member 20. The spring member 20 comprises a clamp contact portion 22 and a substrate contact portion 24. The spring member 20 is positioned between the clamp 18 and a substrate 26 of the semiconductor package 12 in the manner best seen in FIG. 1. In this exemplary embodiment, the clamp contact portion 22 of spring member 20 contacts the clamp 18, and the substrate contact portion 24 of spring member 20 contacts the substrate 26 of the semiconductor package 12. The spring member 20 transfers a portion of the clamping force F from a lid 28 of the semiconductor package 12 to the substrate 26 of the semiconductor package 12.

The semiconductor assembly 10 transfers or distributes a portion of the clamping force F from the lid 28 of the semiconductor package 12 to the substrate 26 of semiconductor package 12. This transfer or distribution of a portion of the clamping force F reduces the stresses imposed on the various components of the semiconductor package 12. The reduced stresses allow for larger clamping forces to be used without the need to increase the strengths of the various components utilized to form the semiconductor package 12. Alternatively, the reduced stresses allow the various components of the semiconductor package 12 to be made less structurally robust or from materials having lower strengths and/or elastic moduli.

For example, one semiconductor packaging specification, known as EV79, has stringent requirements for electrical and thermal performance. To meet these requirements, it has proven necessary to fabricate the semiconductor package from materials that have poor mechanical properties relative to those used for semiconductor packages that do not meet this specification. As an example, the substrate of a semiconductor package designed to meet the requirements of the EV79 specification may be fabricated from a glass ceramic material having a strength and modulus that are only about ¼ and about ⅓, respectively, of those associated with a more conventional substrate fabricated from alumina. Similarly, the adhesive used to secure the lid to the semiconductor die must provide a high thermal conductivity. Unfortunately, however, adhesives having such high thermal conductivities have proven to have less strength than more conventional adhesives. The reduced stresses imposed on the semiconductor package by the semiconductor assembly 10 and spring member 20 of the present invention allow semiconductor packages fabricated from such materials to be securely clamped without structural damage.

The semiconductor assembly 10 and spring member 20 may be readily used with existing semiconductor packages without the need to modify or re-design the semiconductor packages. The spring member may also be formed from a single piece of material, thereby simplifying manufacture.

Having briefly described one embodiment of the semiconductor assembly 10 and spring member 20, various exemplary embodiments of the semiconductor assembly 10 and spring member 20 will now be described in detail.

With reference now primarily to FIG. 1, the semiconductor assembly 10 according to one exemplary embodiment of the present invention may comprise a semiconductor package 12. The semiconductor package 12 may comprise any of a wide range of semiconductor packages that are now known in the art or that may be developed in the future. Consequently, the present invention should not be regarded as limited to any particular type or style of semiconductor package 12. However, by way of example, in one preferred embodiment, the semiconductor package 12 may comprise a land grid array (LGA) type of semiconductor package designed to meet the EV79 specification. While the semiconductor package 12 need not be described in detail in order to practice the present invention, it is useful to describe a few features of a typical semiconductor package 12 in order to provide a basis or context for understanding other aspects of the present invention.

Toward this end, the semiconductor package 12 may comprise a substrate 26 which may be provided with a plurality of contact pads or lands (not shown) thereon in order to allow the semiconductor package 12 to be electrically connected to external circuit elements and/or devices. A semiconductor die 30 is positioned on the substrate 26 and is electrically connected to the substrate 26 so that various circuit nodes of the semiconductor die 30 are electrically connected to the contact pads or lands (not shown) provided on the substrate 26. A lid 28 is secured to the semiconductor die 30 by a suitable die-lid adhesive (not shown). Accordingly, the semiconductor package 12 comprises the multi-layered structural configuration generally illustrated in FIG. 1.

A suitable semiconductor package receiver 14, such as a socket, is provided on the printed wiring board 16. The semiconductor package receiver 14 receives the semiconductor package 12, and provides the means whereby the various lands or contacts (not shown) provided on the semiconductor package 12 are electrically connected to the printed wiring board 16. However, because semiconductor package receivers, such as semiconductor package receiver 14, are well-known in the art and because an understanding of the details of such semiconductor package receivers is not necessary to practice the present invention, the semiconductor package receiver 14 that may be utilized in one preferred embodiment of the invention will not be described in further detail herein.

The clamp 18 is designed to apply a clamping force (e.g., indicated by arrows F) to the lid 28 of the semiconductor package 12, thereby securing the semiconductor package 12 to the receiver 14 in the manner best seen in FIG. 1. Besides serving to clamp or hold the semiconductor package 12 to the semiconductor package receiver 14, the clamp 18 in most applications also serves as a heat sink to dissipate heat produced by the semiconductor package 12 during opera tion. However, it is not necessary for the purposes of the present invention that the clamp 18 function as a heat sink.

The clamp 18 may be secured to the semiconductor package receiver 14 and/or the printed wiring board 16 by any of a wide variety of systems and devices well-known in the art. By way of example, in one embodiment, the clamp 18 is secured to the semiconductor package receiver 14 and/or the printed wiring board 16 by a plurality of threaded studs 30 provided in either the package receiver 14 and/or the printed wiring board 16. The threaded studs 30 allow the clamp 18 to be tightened against the semiconductor package 12, thereby applying the clamping force F to the semiconductor package 12.

The biasing or spring member 20 is best seen in FIG. 2 and may comprise a generally rectangularly-shaped plate-like member 34 having a periphery 36 and an opening 38 provided therein. The opening 38 may be sized to receive the lid 28 of semiconductor package 12. The spring member 20 may also be provided with a plurality of finger members 40, each of which extends generally inwardly from the periphery 38 of the generally rectangularly-shaped plate-like member 34 to the opening 38. In one embodiment, the distal ends 42 are curved or up-turned slightly, as best seen in FIG. 1. In addition, the distal ends 42 of finger members 40 together generally define the opening 38, as best seen in FIG. 2. The configuration is such that the periphery 36 of spring member 20 defines a plane 44 (FIG. 1), with the distal ends 42 of each finger member 40 being displaced generally downwardly from the plane 44. Stated another way, the distal ends 42 of each finger member 40 are non-coplanar with plane 44. When assembled in the manner illustrated in FIG. 1, the periphery 36 of the spring member 20 forms the clamp contact portion 22 of spring member 20, whereas the distal ends 42 of finger members 40 form the substrate contact portion 24 of spring member 20. Finally, the spring member 20 may be provided with one or more holes 46 therein sized to receive the threaded studs 30.

The spring member 20 may be manufactured from any of a wide range of materials suitable or desirable for the intended application. However, in certain applications it will be desirable to fabricate the spring member 20 from a material having a combination of high strength and low stiffness. By way of example, in one embodiment, the spring member 20 is fabricated from a beryllium-copper alloy having a yield strength of about 1000 Mpa and a modulus of about 127 Gpa. The yield strength of this alloy is comparable to steel, whereas the modulus is about half that of steel. This comparatively low modulus allows the spring member 20 to have a low stiffness, thereby making it relatively insensitive to the normally expected tolerance variations in the distance between the substrate 26 and the clamp 18.

As mentioned above, the spring member 20 transfers a portion of the clamping force F from the lid 28 of the semiconductor package 12 to the substrate 26 of the semiconductor package 12. In one embodiment, the spring member 20 is designed so that it transfers approximately half of the clamping force from the lid 28 to the substrate 26, thereby substantially reducing the stresses imposed on the substrate 26 (e.g., via the lid 28 and/or die 30) as well as the die-lid adhesive (not shown).

It is contemplated that the inventive concepts herein described may be variously otherwise embodied, and it is intended that the appended claims be construed to include alternative embodiments of the invention except insofar as limited by the prior art.

What is claimed is:

1. A semiconductor assembly, comprising:
a semiconductor package comprising a substrate, a die positioned on the substrate, and a lid positioned on the die;
a receiver sized to receive said semiconductor package;
a clamp, said clamp engaging the lid of said semiconductor package and said receiver, said clamp applying a clamping force to the lid of said semiconductor package to hold said semiconductor package to said receiver; and
a spring member positioned between said clamp and the substrate of said semiconductor package, said spring member comprising a plate-like member having an opening therein sized to receive the lid of said semiconductor package, said spring member also comprising a clamp contact portion contacting said clamp and a substrate contact portion contacting the substrate of said semiconductor package, said spring member transferring a portion of the clamping force from the lid of said semiconductor package to the substrate of said semiconductor package.

2. The semiconductor assembly of claim 1, wherein said spring member comprises a generally rectangular configuration.

3. The semiconductor assembly of claim 1, wherein said spring member further comprises at least one finger member having a distal end, said at least one finger member extending from about a periphery of said spring member to about the opening in said spring member so that the distal end of said at least one finger member is located at about the opening in said spring member.

4. The semiconductor assembly of claim 3, wherein the periphery of said spring member defines a plane and wherein the distal end of said at least one finger member is not co-planar with said plane.

5. The semiconductor assembly of claim 3, wherein the periphery of said spring member comprises the clamp contact portion of said spring member and wherein the distal end of said at least one finger member comprises the substrate contact portion of said spring member.

6. The semiconductor assembly of claim 1, wherein said spring member comprises a beryllium-copper alloy.

7. The semiconductor assembly of claim 1, wherein said clamp comprises a heat sink.

8. The semiconductor assembly of claim 1, wherein said semiconductor package comprises a land grid array semiconductor package.

9. A spring member comprising a plate-like member having a generally rectangular configuration having an opening therein, said spring member also comprising a clamp contact portion and a substrate contact portion, said spring member being positionable between a clamp and a substrate of a semiconductor package, so that said spring member transfers to the substrate of the semiconductor package a portion of a clamping force applied by the clamp to a lid of the semiconductor package and so that the opening receives the lid of the semiconductor package.

10. The spring member of claim 9, wherein said spring member further comprises at least one finger member having a distal end, said at least one finger member extending from about a periphery of said spring member to about the opening in said spring member so that the distal end of said at least one finger member is located at about the opening in said spring member.

11. The spring member of claim 10, wherein the periphery of said spring member defines a plane and wherein the distal end of said at least one finger member is displaced from said plane.

12. The spring member of claim 10, wherein the periphery of said spring member comprises the clamp contact portion of said spring member and wherein the distal end of said at least one finger member comprises the substrate contact portion of said spring member.

13. The spring member of claim 9, wherein said spring member comprises a beryllium-copper alloy.

14. An improved semiconductor mounting system of the type in which a clamp applies a clamping force to a lid of a semiconductor package to hold the semiconductor package to a semiconductor package receiver, wherein the improvement comprises a biasing member comprising a platelike member having an opening therein sized to receive the lid of said semiconductor package, said biasing member being positioned between the clamp and a substrate of the semiconductor package, said biasing member transferring a portion of the clamping force from the lid of the semiconductor package to the substrate of the semiconductor package.

15. A semiconductor assembly, comprising:
a semiconductor package having a lid and a substrate;
semiconductor package receiver means for receiving said semiconductor package;
clamp means operatively associated with said semiconductor package and said semiconductor package receiver means for applying a clamping force to the lid of said semiconductor package to hold said semiconductor package to said semiconductor package receiver means; and
biasing means positioned between said clamp means and the substrate of said semiconductor package for transferring a portion of the clamping force from the lid of said semiconductor package to the substrate of said semiconductor package, said biasing means comprising a plate-like member having an opening therein sized to receive the lid of said semiconductor package.

* * * * *

UNITED STATES PATENT AND TRADEMARK OFFICE
CERTIFICATE OF CORRECTION

PATENT NO.        : 6,977,434 B2                                          Page 1 of 1
APPLICATION NO. : 10/690397
DATED             : December 20, 2005
INVENTOR(S)       : Peter Miguel Martino It is certified that error appears in the above-identified patent and that said Letters Patent is hereby corrected as shown below:

In column 6, line 28, in Claim 14, delete "platelike" and insert -- plate-like --, therefor.

Signed and Sealed this

Twenty-eighth Day of July, 2009

JOHN DOLL
*Acting Director of the United States Patent and Trademark Office*